United States Patent
Chang et al.

(10) Patent No.: US 8,338,256 B2
(45) Date of Patent: Dec. 25, 2012

(54) MULTI-GATE TRANSISTOR HAVING SIDEWALL CONTACTS

(75) Inventors: Josephine B. Chang, Mahopac, NY (US); Dechao Guo, Wappingers Falls, NY (US); Shu-Jen Han, Wappingers Falls, NY (US); Chung-Hsun Lin, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 341 days.

(21) Appl. No.: 12/832,829

(22) Filed: Jul. 8, 2010

(65) Prior Publication Data

US 2012/0007183 A1 Jan. 12, 2012

(51) Int. Cl.
*H01L 21/336* (2006.01)
*H01L 29/76* (2006.01)

(52) U.S. Cl. ........ 438/270; 438/197; 438/279; 438/281; 438/282; 257/329; 257/330; 257/347; 257/348; 257/365; 257/E21.415; 257/E21.444; 257/E29.117; 257/E29.137

(58) Field of Classification Search .......... 438/197, 438/270, 279, 281, 282; 257/329, 330, 347, 257/348, 365, E21.415, E21.444, E29.117, 257/E29.137
See application file for complete search history.

(56) References Cited

U.S. PATENT DOCUMENTS

| 6,583,469 | B1 * | 6/2003 | Fried et al. ............... 257/329 |
| 6,657,259 | B2 | 12/2003 | Fried et al. |
| 6,815,277 | B2 | 11/2004 | Fried et al. |
| 6,962,843 | B2 | 11/2005 | Anderson et al. |
| 7,078,299 | B2 | 7/2006 | Maszara et al. |
| 7,241,649 | B2 | 7/2007 | Donze et al. |
| 7,265,417 | B2 | 9/2007 | Adkisson et al. |
| 7,575,962 | B2 | 8/2009 | Cho et al. |
| 2005/0263821 | A1 * | 12/2005 | Cho et al. ............... 257/347 |
| 2006/0166456 | A1 * | 7/2006 | Fujiwara et al. ......... 438/399 |
| 2007/0138599 | A1 | 6/2007 | Ahn et al. |
| 2007/0181959 | A1 * | 8/2007 | Park et al. ............... 257/401 |
| 2009/0078999 | A1 * | 3/2009 | Anderson et al. ........ 257/348 |
| 2011/0092039 | A1 * | 4/2011 | Kim et al. ............... 438/270 |
| 2012/0097950 | A1 * | 4/2012 | Son et al. ................ 257/57 |

* cited by examiner

*Primary Examiner* — Dao H Nguyen
(74) *Attorney, Agent, or Firm* — Cantor Colburn LLP; Vazken Alexanian

(57) ABSTRACT

A multi-gate transistor having a plurality of sidewall contacts and a fabrication method that includes forming a semiconductor fin on a semiconductor substrate and etching a trench within the semiconductor fin, depositing an oxide material within the etched trench, and etching the oxide material to form a dummy oxide layer along exposed walls within the etched trench; and forming a spacer dielectric layer along vertical sidewalls of the dummy oxide layer. The method further includes removing exposed dummy oxide layer in a channel region in the semiconductor fin and beneath the spacer dielectric layer, forming a high-k material liner along sidewalls of the channel region in the semiconductor fin, forming a metal gate stack within the etched trench, and forming a plurality of sidewall contacts within the semiconductor fin along adjacent sidewalls of the dummy oxide layer.

10 Claims, 3 Drawing Sheets

MULTI-GATE TRANSISTOR HAVING SIDEWALL CONTACTS

BACKGROUND

The present invention relates to multi-gate transistors and a method for fabricating the same, and more specifically, to multi-gate field effect transistor (FET) having plurality of sidewall contacts.

A typical complementary metal-oxide-semiconductor (CMOS) static random access memory (SRAM) cell consists of several multi-gate FETs, for example, P-channel FETs and N-channel FETs. Each FET includes a metal gate stack and at least one semiconductor fin formed vertically along a substrate.

Today, the multi-gate FET has been a targeted structure for scaling CMOS technology to a sub 22 nanometer (nm) node, for example. Problems may include a short channel length and a short contact length in the gate pitch, thereby limiting the performance of the multi-gate FET and increases the FET's variability.

SUMMARY

The present invention provides a multi-gate transistor (i.e., FET) having plurality of sidewall contacts that reduces the variability at the gate pitch, resulting in a constant gate pitch compared to that of the conventional multi-gate FET. The multi-gate transistor of the present invention also increases the effective channel length and reduces parasitic resistance by militating 3D spreading resistance in the multi-gate transistor.

According to an embodiment of the present invention a method for fabricating a FinFET device is provided. The method includes forming a semiconductor fin on a semiconductor substrate and etching a trench within the semiconductor fin, depositing an oxide material within the etched trench, and etching the oxide material to form a dummy oxide layer along exposed walls within the etched trench; and forming a spacer dielectric layer along vertical sidewalls of the dummy oxide layer. The method further includes removing exposed dummy oxide layer in a channel region in the semiconductor fin and beneath the spacer dielectric layer, forming a high-k material liner along sidewalls of the channel region in the semiconductor fin, forming a metal gate stack within the etched trench, and forming a plurality of sidewall contacts within the semiconductor fin along adjacent sidewalls of the dummy oxide layer.

According to another embodiment of the present invention, a FinFET device is provided. The FinFET device includes a semiconductor fin formed in a substrate, a trench formed within the semiconductor fin having a curved surface along a channel region in the semiconductor fin, a metal gate stack formed within the trench, and plurality of sidewall contacts formed along adjacent sidewalls of the metal gate stack.

According to another embodiment of the present invention, a multi-gate transistor is provided. The multi-gate transistor includes a semiconductor fin formed in a substrate, a trench formed within the semiconductor fin having a curved surface along a channel region in the semiconductor fin, a metal gate stack formed within the trench, and plurality of sidewall contacts formed along adjacent sidewalls of the metal gate stack.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
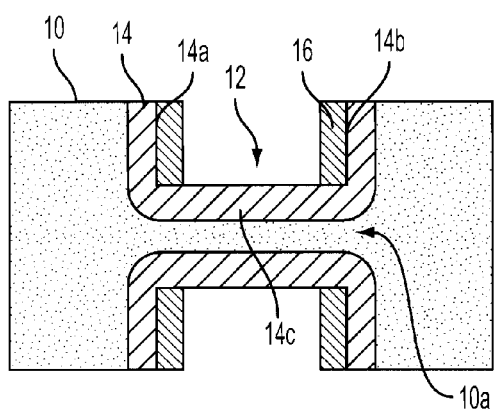
FIG. 1 is a diagram illustrating a fabrication operation of a dummy oxide layer and spacer material of a multi-gate transistor that can be implemented within embodiments of the present invention.

FIGS. 1 through 5 illustrate a fabrication method for fabricating multi-gate transistor according to an embodiment of the present invention. Wherever possible, the same reference numerals are used in the drawings and the descriptions of the same or like parts.

According to an embodiment of the present invention, the multi-gate transistor may be applied to a metal-oxide-semiconductor (CMOS) static random access memory (SRAM) cell; however, the present invention may be applied to other technology areas, as applicable. With reference now to FIG. 1, a formation operation of a dummy oxide layer and spacer within a semiconductor fin is provided. In FIG. 1 a semiconductor fin 10 is shown. The semiconductor fin 10 may be formed of silicon, however the present invention is not limited hereto, and other suitable materials may be utilized. After the formation of the semiconductor fin 10 in a semiconductor substrate (not shown) and etching a trench 12 within the semiconductor fin 10. In the views shown in FIGS. 1 through 5, the semiconductor substrate is located beneath the semiconductor fin 10. A predetermined thickness of the trench ranges from approximately 5 nanometers (nm) to approximately 20 nanometers (nm). An oxide material is deposited within the etched trench 12 and the oxide material is etched via an etching technique, for example, to form a dummy oxide layer 14 along exposed walls within the etched trench 12. According to an embodiment of the present invention, the dummy oxide layer 14 may be formed of silicon dioxide, for example. A spacer dielectric layer 16 is formed along vertical sidewalls 14a, 14b of the dummy oxide layer 14. A selective removal process may be performed by spacer reactive ion etching (RIE) operation (anisotropic etch process), for example, to form the spacer dielectric layer 16. The spacer RIE operation may employs argon, fluorine or chlorine high energetic ions to perform the etching process. According to an embodiment of the present invention, the spacer dielectric layer 16 may be formed of silicon nitride, for example, via a deposition process such as chemical vapor deposition (CVD). The spacer dielectric layer 16 may be formed of a thickness of approximately 10 nanometers (nm), for example. A removal operation of an exposed portion of the dummy oxide layer 14 will now be discussed with reference to FIG. 2.

Figure 2:
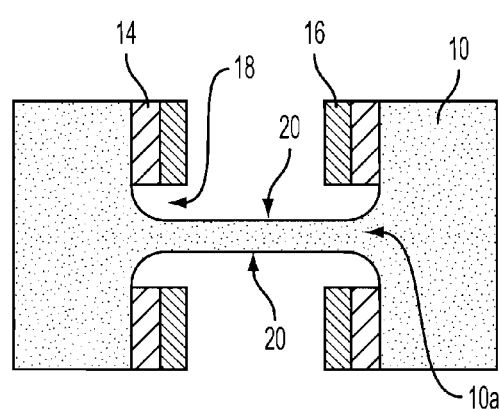
FIG. 2 is a diagram illustrating a removal operation of the dummy oxide layer of the multi-gate transistor that can be implemented within embodiments of the present invention.

FIG. 2 is a diagram illustrating a removal operation of the dummy oxide layer of the multi-gate transistor that can be implemented within embodiments of the present invention. As shown in FIG. 2, an exposed portion 14c of the dummy oxide layer 14 in a channel region 10a of the semiconductor fin and beneath the spacer dielectric layer 16 is removed. As a result of the removal operation, a curved trench 18 is formed in the channel region 10a of the semiconductor fin 10, forming curved sidewalls 20 of the semiconductor fin 10 within the channel region 10a. That is, portions of the dummy oxide layer 14 are removed under the spacer dielectric layer 16 up to a predetermined distance such that a thickness of the remaining sidewall portions of the dummy oxide layer 14 is a same thickness of the spacer dielectric layer 16. According to an embodiment of the present invention, a depth of the curved trench 18 may range from approximately 2 nanometers (nm) to approximately 5 nanometers (nm) but is not limited hereto and may vary as needed. A high-k material deposition operation will now be discussed with reference to FIG. 3.

Figure 3:
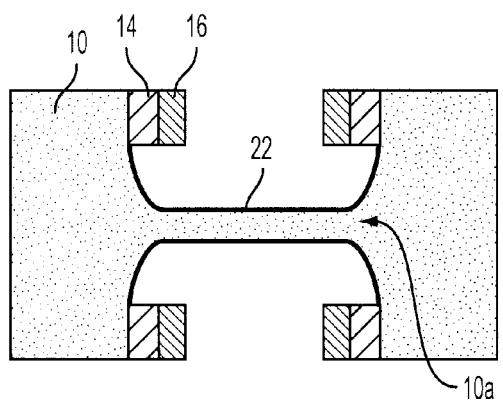
FIG. 3 is a diagram illustrating a deposition operation of high-K material of the multi-gate transistor that can be implemented within embodiments of the present invention.

FIG. 3 is a diagram illustrating a deposition operation of high-k material of the multi-gate transistor that can be implemented within embodiments of the present invention. As shown in FIG. 3, after removal of the exposed dummy oxide layer 14, a high-k material liner 22 is formed within the curved trench 18, along sidewalls 20 of the channel region 10a of the semiconductor fin 10. A formation operation of a metal gate stack of the multi-gate transistor will be described below with reference to FIG. 4.

Figure 4:
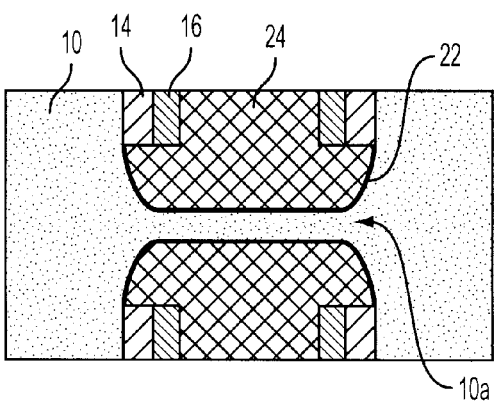
FIG. 4 is a diagram illustrating a formation operation of a metal gate stack of the multi-gate transistor that can be implemented within embodiments of the present invention.
Figure 5:
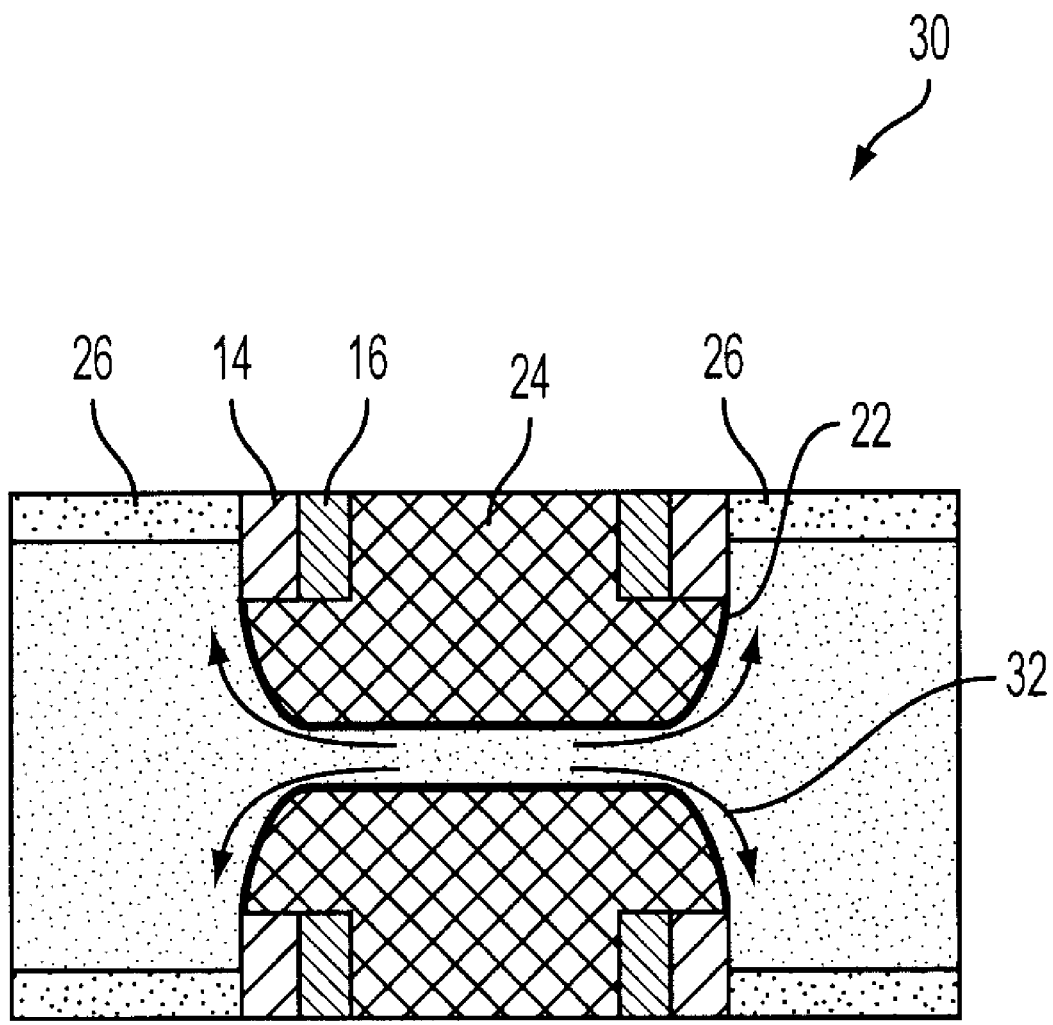
FIG. 5 is a formation operation of plurality of sidewall contacts of the multi-gate transistor and a multi-gate transistor resulting from the fabrication operations in FIGS. 1 through 5 that can be implemented within embodiments of the present invention.

FIG. 4 is a diagram illustrating a formation operation of a metal gate stack of the multi-gate transistor that can be implemented within embodiments of the present invention. As shown in FIG. 4, a metal gate stack 24 is formed within the trench 12 (including the curved trench 18). According to an embodiment of the present invention, the metal gate stack 24 may be formed of any suitable gate material including doped and un-doped polysilicon and metals such as tungsten (W), titanium (Ti), molybdenum (Mo) and aluminum (Al). Since a gate material is formed over both sidewalls 20, the resulting multi-gate transistor 30 (as depicted in FIG. 5) may be double-gated. The present invention, also provides plurality of sidewall contacts within the multi-gate transistor. A formation operation of the plurality of sidewall contacts will now be described below with reference to FIG. 5.

FIG. 5 is a formation operation of plurality of sidewall contacts of the multi-gate transistor and a multi-gate transistor resulting from the fabrication operations in FIGS. 1 through 5 that can be implemented within embodiments of the present invention. As shown in FIG. 5, a plurality of sidewall contacts 26 are each formed within the semiconductor fin 10 along adjacent sidewalls of the dummy oxide layer 14. According to an embodiment of the present invention, the sidewall contacts 26 are formed of a predetermined thickness ranging from approximately 5 nanometers (nm) to approximately 10 nanometers (nm) and may be formed silicide, for example.

As further shown in FIG. 5, current flows through the channel region 10a in a direction along the high-k material liner 22 to the sidewall contacts 26 as illustrated by the arrows 32. That is, based on the curved structure of the channel region 10a, the current is forced to flow to the sidewall contacts 26. The resultant multi-gate transistor 30 (e.g., a FinFET device) is provided. The FinFET device 30 includes a semiconductor fin 10 formed in a substrate 1, a trench 12 formed within the semiconductor fin 10 having a curved surface 20 along a channel region 10a of the semiconductor fin 10. A metal gate stack 24 formed within the trench 12, and a plurality of sidewall contacts 26 formed along adjacent sidewalls of the metal gate stack 24. Based on the fabrication of the multi-gate transistor 30, according to embodiments of the present invention, the channel region 11 in the semiconductor fin 10 is longer in length that that of a conventional multi-gate transistor.

The multi-gate transistor according to embodiments of the present invention provides the advantages of reducing the variability at a tight pitch gate such that the gate pitch remains constant therein in comparison to that of a conventional multi-gate transistor and produces an increase in effective channel length which reduces variability due to process variations. The multi-gate transistor of the present invention also reduces parasitic resistance.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for fabricating a FinFET device, the method comprising:

forming a semiconductor fin on a semiconductor substrate, and etching a trench within the semiconductor fin;

depositing an oxide material within the etched trench, and etching the oxide material to form a dummy oxide layer along exposed walls within the etched trench;

forming a spacer dielectric layer along vertical sidewalls of the dummy oxide layer;

removing exposed portions of the dummy oxide layer in a channel region in the semiconductor fin and beneath the spacer dielectric layer;

forming a high-k material liner along sidewalls of the channel region in the semiconductor fin;

forming a metal gate stack within the etched trench; and forming a plurality of sidewall contacts within the semiconductor fin along adjacent sidewalls of the dummy oxide layer.

2. The method of claim 1, wherein the semiconductor fin is formed of silicon.

3. The method of claim 1, wherein the dummy oxide layer is formed of silicon dioxide.

4. The method of claim 1, wherein the spacer dielectric layer is formed of nitride.

5. The method of claim 1, wherein the removing of exposed dummy oxide layer in a channel region in the semiconductor fin and beneath the spacer dielectric layer forms a curved trench within the channel region, wherein the high-k material liner is formed along the curved trench.

6. The method of claim 5, wherein current flows through the channel region in a direction along the high-k material liner to the plurality of sidewall contacts.

7. The method of claim 5, wherein a depth of the curved trench ranges from approximately 2 nanometers (nm) to approximately 5 nanometers (nm).

8. The method of claim 1, wherein the plurality of sidewall contacts are formed of a predetermined thickness ranging from approximately 5 nanometers (nm) to approximately 10 nanometers (nm).

9. The method of claim 1, wherein a predetermined thickness of the exposed trench ranges from approximately 2 nanometers (nm) to approximately 5 nanometers (nm).

10. The method of claim 1, wherein the plurality of sidewall contacts are formed of silicide.

* * * * *